(12) United States Patent
Yang

(10) Patent No.: US 10,290,661 B2
(45) Date of Patent: May 14, 2019

(54) THIN FILM TRANSISTOR AND METHOD OF FABRICATING THE SAME, ARRAY SUBSTRATE AND DISPLAY APPARATUS

(71) Applicant: BOE TECHNOLOGY GROUP CO., LTD., Beijing (CN)

(72) Inventor: Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 14 days.

(21) Appl. No.: 15/677,542

(22) Filed: Aug. 15, 2017

(65) Prior Publication Data

US 2018/0061870 A1 Mar. 1, 2018

(30) Foreign Application Priority Data

Aug. 25, 2016 (CN) .......................... 2016 1 0727437

(51) Int. Cl.
*H01L 27/12* (2006.01)
*H01L 29/66* (2006.01)
*H01L 29/786* (2006.01)

(52) U.S. Cl.
CPC ...... *H01L 27/1262* (2013.01); *H01L 27/1225* (2013.01); *H01L 27/1288* (2013.01); *H01L 29/66969* (2013.01); *H01L 29/7869* (2013.01)

(58) Field of Classification Search
CPC ............. H01L 27/1288; H01L 27/1225; H01L 27/124; H01L 27/127; H01L 29/66969; H01L 29/7869
See application file for complete search history.

(56) References Cited

U.S. PATENT DOCUMENTS

| 9,761,731 B2 | 9/2017 | Long et al. | |
| 2015/0162351 A1* | 6/2015 | Hiwatashi | H01L 27/124 257/43 |
| 2015/0162358 A1* | 6/2015 | Inoue | H01L 27/1225 257/43 |

FOREIGN PATENT DOCUMENTS

CN 104253159 A 12/2014

OTHER PUBLICATIONS

First office Action in corresponding application No. CN201610727437.4 dated Aug. 21, 2018 and English Translation attached.

\* cited by examiner

*Primary Examiner* — David C Spalla
(74) *Attorney, Agent, or Firm* — Nath, Goldberg & Meyer; Joshua B. Goldberg

(57) ABSTRACT

A method of fabricating a TFT includes a step of forming a gate electrode, a gate insulation layer, an active layer, a source electrode, a drain electrode, a passivation layer and a connection electrode, wherein a pattern including the gate electrode, the source electrode and the drain electrode, the active layer and the gale insulation layer is formed by one patterning process, a pattern including the passivation layer and a via hole through the passivation layer is formed by one patterning process, and a pattern of the connection electrode is formed by one patterning process to electrically connect the source electrode and the drain electrode with the active layer.

8 Claims, 10 Drawing Sheets

# THIN FILM TRANSISTOR AND METHOD OF FABRICATING THE SAME, ARRAY SUBSTRATE AND DISPLAY APPARATUS

TECHNICAL FIELD

The present invention belongs to the field of display technology, and specifically relates to a method of fabricating a thin film transistor (TFT), a TFT, an array substrate and a display apparatus.

BACKGROUND

At present, in the field of flat panel display technology, a TFT liquid crystal display (referred to as TFT-LCD for short) has advantages such as a small size, low power consumption and relatively low manufacturing cost, and gradually dominates today's flat panel display market.

Current TFTs are mainly amorphous silicon TFTs and organic TFTs, a fabricating method of which includes sequentially depositing, on a substrate, various film layers having different properties such as an active layer, a dielectric layer, a metal electrode layer and the like, and forming respective patterns. With the development of the TFT-LCD technology, a technique of oxide thin film transistor (OTFT) has become more and more developed. The OTFT technique has advantages such as high carrier mobility, low power consumption and applicability to low frequency driving, and in particular, it can be applied to organic light emitting diode display apparatus known as the next generation display technology. However, as compared to a conventional process, the fabrication process of OTFT is more difficult in implementation, and its procedure is complicated in that it typically requires a patterning process for more than six times, which will greatly limit the capacity of a production line.

How to optimize the fabrication process of TFTs, especially OTFTs, and reduce the steps of patterning processes, has become an urgent technical problem to be solved.

SUMMARY

In view of at least the above problem existing in the prior art, there is provided a method of fabricating a TFT, a TFT, an array substrate and a display apparatus, wherein the method of fabricating the TFT at least partially solves the problem that the number of masks is large in the fabrication process of TFT's.

In an aspect, embodiments of the present invention provide a method of fabricating a TFT including a substrate, a gate electrode, a gate insulation layer, an active layer, a source electrode, a drain electrode, a passivation layer and a connection electrode, and the method includes:

forming a first conductive film layer, a gate insulation film layer and an active film layer on the substrate;

patterning the first conductive film layer, the active film layer and the gate insulation film layer by one patterning process to form a pattern of the gate electrode, the source electrode and the drain electrode, a pattern of the active layer, and a pattern of the gate insulation layer, respectively;

forming a passivation film layer on a side of the gate electrode, the source electrode, the drain electrode, the active layer and the gate insulation layer distal to the substrate;

patterning the passivation film layer by one patterning process to form a pattern including the passivation layer and a via hole through the passivation layer;

forming a second conductive film layer on a side of the passivation layer distal to the substrate; and patterning the second conductive film layer by one patterning process to form a pattern of the connection electrode, the connection electrode being configured to electrically connect the source electrode and the drain electrode to the active layer, respectively.

Optionally, the first conductive film layer, the gate insulation film layer and the active film layer are formed on the substrate sequentially in a direction away from the substrate, and the step of forming the patterns of the gate electrode, the source electrode, the drain electrode, the active layer and the gate insulation layer by one patterning process includes:

forming the pattern of the gate electrode, the source electrode and the drain electrode by performing an exposure process and an etching process one time; and forming the patterns of the gate insulation layer and the active layer by an ashing process and an etching process, such that the source electrode and the drain electrode are at least partially exposed.

Optionally, the exposure process is performed by using a halftone mask which includes a blocking region for blocking ultraviolet light, a partial transmissive region for allowing the ultraviolet light to partially transmit therethrough, and a transmissive region for allowing the ultraviolet light to completely transmit therethrough. An orthographic projection of each of the gate insulation layer and the active layer completely overlaps with that of the blocking region, a portion of an orthographic projection of the source electrode and the drain electrode not covered by the orthographic projection of each of the gate insulation layer and the active layer completely overlaps with an orthographic projection of the partial transmissive region, and an orthographic projection of gaps between the source electrode, the drain electrode and the gate electrode completely overlaps with that of the transmissive region.

Optionally, during the ashing process and the etching process, the patterns of the active layer and the gate insulation layer are formed on the gate electrode, the drain electrode and the source electrode, and an area of the orthographic projection of each of the gate insulation layer and the active layer on the source electrode is less than that of the orthographic projection of the source electrode, and an area of the orthographic projection of each of the gate insulation layer and the active layer on the drain electrode is less than that of the orthographic projection of the drain electrode.

Optionally, during the ashing process and the etching process, the patterns of the gate insulation layer and the active layer are formed only on the gate electrode.

Optionally, the exposure process is a process of double-slit diffraction.

Optionally, the step of forming the pattern including the passivation layer and the via hole through the passivation layer includes:

forming a first via hole and a second via hole through the passivation layer to expose a portion of a first region of the active layer, respectively, the first region of the active layer being stacked with the gate insulation layer and the gate electrode, and an orthographic projection of at least a portion of the first region of the active layer overlapping with that of the gate electrode; and forming a third via hole through the passivation layer to expose a portion of the source electrode, and forming a fourth via hole through the passivation layer to expose a portion of the drain electrode, wherein the connection electrode is formed to electrically connect the source electrode and the active layer via the first and third via holes and electrically connect the drain electrode and the active layer via the second and fourth via holes.

Optionally, the active film layer, the gate insulation film layer and the first conductive film layer are formed on the substrate sequentially in a direction away from the substrate;

the step of forming the patterns of the gate electrode, the source electrode, the drain electrode, the active layer and the gate insulation layer by one patterning process includes:

processing the first conductive film layer, the active layer and the gate insulation film layer by performing an exposure process and an etching process one time, thereby forming the pattern of the source electrode and the drain electrode from the first conductive film layer and forming the pattern of the active layer from the active film layer; and processing the gate insulation film layer and the first conductive film layer by performing an ashing process and an etching process, thereby forming the patterns of the gate insulation layer and the gate electrode from the gate insulation film layer and the first conductive film layer, respectively, an area of the orthographic projection of the active layer being larger than that of the orthographic projection of each of the gate insulation layer and the gate electrode.

Optionally, the exposure process is performed by using a halftone mask which includes a blocking region for blocking ultraviolet light, a partial transmissive region for allowing the ultraviolet light to partially transmit therethrough, and a transmissive region for allowing the ultraviolet light to completely transmit therethrough; an orthographic projection of each of the gate insulation layer and the gate electrode completely overlaps with that of the blocking region, an orthographic projection of a portion of the active layer not covered by the gate insulation layer completely overlaps with that of the partial transmissive region, and an orthographic projection of gaps between portions of the active layer completely overlaps with that of the transmissive region.

Optionally, the active layer is formed of a metal oxide.

In another aspect, embodiments of the present invention provide a TFT including a substrate, a gate electrode, a gate insulation layer, an active layer, a source electrode, a drain electrode, a passivation layer and a connection electrode. The gate electrode, the source electrode and the drain electrode are disposed in a same layer and insulated from each other, the gate insulation layer and the active layer are disposed at a same side of the gate electrode, the passivation layer is disposed at a side of the gate electrode, the source electrode and the drain electrode distal to the substrate, the connection electrode is disposed at a side of the passivation layer distal to the substrate, and the source and drain electrodes are connected to the active layer via the connection electrode, respectively.

Optionally, the gate insulation layer and the active layer are disposed on the gate electrode, the source electrode and the drain electrode sequentially in a direction away from the substrate; an area of the orthographic projection of each of the gate insulation layer and the active layer on the gate electrode is less than or equal to that of an orthographic projection of the gate electrode, an area of the orthographic projection of each of the gate insulation layer and the active layer on the source electrode is less than that of the orthographic projection of the source electrode, and an area of the orthographic projection of each of the gate insulation layer and the active layer on the drain electrode is less than that of the orthographic projection of the drain electrode.

Optionally, the gate insulation layer and the active layer are disposed sequentially in a direction away from the substrate and disposed only on the gate electrode, and the area of the orthographic projection of each of the gate insulation layer and the active layer is less than or equal to that of the orthographic projection of the gate electrode.

Optionally, the passivation layer is provided with first to fourth via holes through the passivation layer. The first and second via holes each expose a portion of a first region of the active layer, the first region of the active layer being stacked with the gate insulation layer and the gate electrode, and an orthographic projection of at least a portion of the first region of the active layer overlapping with that of the gate electrode. The third via hole exposes a portion of the source electrode, and the fourth via hole exposes a portion of the drain electrode. The connection electrode is provided on the passivation layer, and connects the source electrode and the active layer via the first and third via holes and connects the drain electrode and the active layer via the second and fourth via holes.

Optionally, the gate insulation layer and the active layer are sequentially disposed under the gate electrode, the source electrode and the drain electrode, and an area of the orthographic projection of the active layer is larger than that of the orthographic projection of each of the gate insulation layer and the gate electrode.

Optionally, the gate electrode, the source electrode and the drain electrode are made of a same conductive material.

Optionally, the active layer is made of a metal oxide.

In another aspect, embodiments of the present invention provide an array substrate including a plurality of pixel regions and the above-described TFT, wherein the TFT is disposed at a corner of each of the pixel regions, and the drain electrode of the TFT is configured to extend towards a center of each of the pixel regions to form a pixel electrode.

Optionally, the array substrate includes a gate line and a data line intersecting with each other and defining the pixel regions, wherein the gate line is connected to the gate electrode, the data line is connected to the source electrode, one of the gate line and the data line is disconnected in an intersection area where the gate line and the data line intersect with each other, and the disconnected one of gate line and the data line is connected via a line connection electrode formed in the same layer as the connection electrode.

In another aspect, embodiments of the present invention provide a display apparatus including the above-described array substrate.

The TFT according to the embodiments of the present invention has a simple substrate, and the method of fabricating the TFT can effectively reduce the number of the masks, improve production capability and save cost.

DETAILED DESCRIPTION

Figure 1:
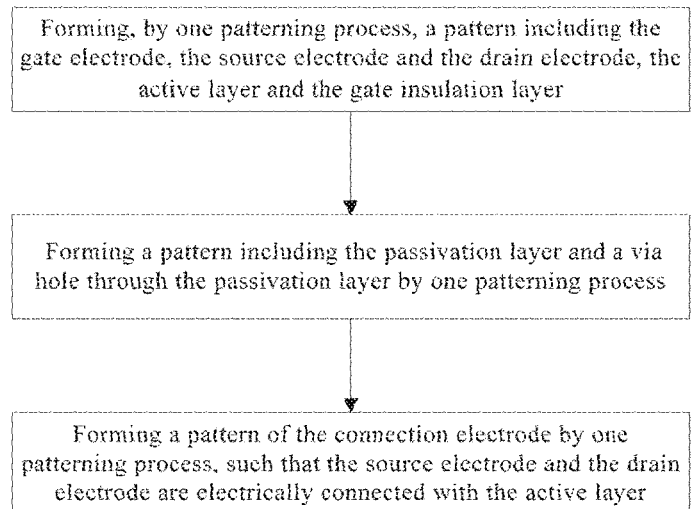
FIG. 1 is a flow chart of a method of fabricating a TFT according to an embodiment of the present invention.

To make those skilled in the art better understand the technical solutions of the present invention, a method of fabricating a TFT, a TFT, an array substrate and a display apparatus according to the present invention will be further described in detail below in conjunction with the accompanying drawings and specific implementations.

In the present disclosure, the term "one patterning process" may refer to a process of patterning by using one and the same mask, and the term "same layer" may refer to a layer formed by one patterning process.

Embodiments of the present invention provide a TFT and a method of fabricating the same, the TFT has a simple structure, and the method of fabricating the same can effectively reduce the number of masks, improve production capability and save cost.

Referring to FIGS. 1, 2A-2I and 3A-3B, a method of fabricating a TFT includes a step of forming a gate electrode 2, a gate insulation layer 3, an active layer 4, a source electrode 5, a drain electrode 6, a passivation layer 7 and a connection electrode 8, wherein a pattern including the gate electrode 2, the source electrode 5, the drain electrode 6, the active layer 4 and the gate insulation layer 3 is formed by one patterning process, a pattern including the passivation layer 7 and a via hole through the passivation layer 7 is formed by one patterning process, and a pattern of the connection electrode 8 is formed by one patterning process so as to electrically connect the source electrode 5 and the drain electrode 6 with the active layer 4. The TFT is formed on the substrate 1, and during the fabrication process, the active layer 4, the gate insulation layer 3, the gate electrode 2, the source electrode 5 and the drain electrode 6 are formed by using one mask, and the source electrode 5, the drain electrode 6 and the active layer 4 are electrically connected by the connection electrode 8 to form a conductive channel of the TFT in the ON state. The method of fabricating the TFT effectively reduces the number of masks, improves production capability and saves cost.

In the method, a pattern including the gate electrode 2, the source electrode 5, the drain electrode 6, the active layer 4 and the gate insulation layer 3 is formed by one patterning process.

Figure 2A:
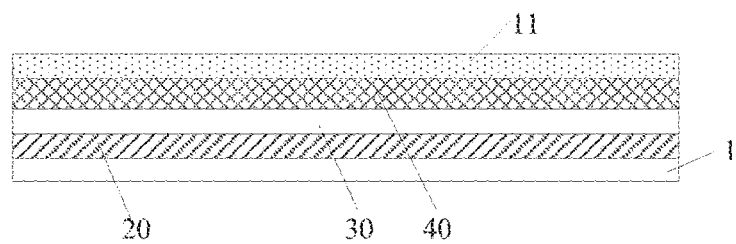
FIGS. 2A-2I are structural schematic diagrams illustrating a TFT fabricated by a method of fabricating the TFT according to an embodiment of the present invention.

In a step S11, a first conductive film layer, a gate insulation film layer and an active film layer are formed on the substrate sequentially in a direction away from the substrate. As illustrated in FIG. 2A, the first conductive film layer 20, the gate insulation film layer 30 and the active film layer 40 are formed sequentially on the substrate 1, and a photoresist 11 covers the active film layer 40.

Figure 2B:
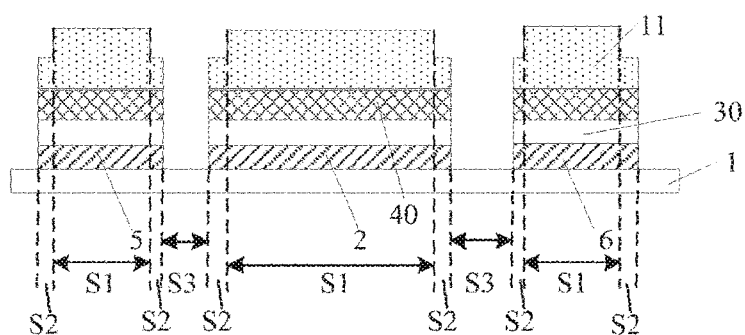
Figure 2C:
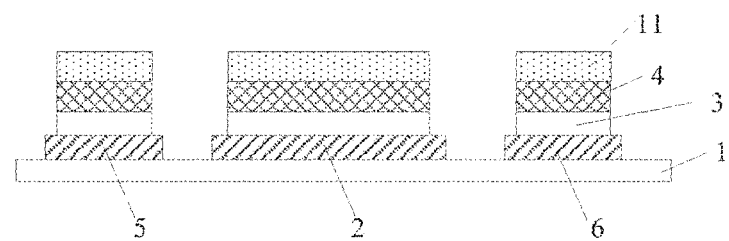

Then, in a step S12, a pattern including the gate electrode 2, the source electrode 5 and the drain electrode 6 is formed by performing an exposure process and an etching process one time. The exposure process herein is a process of double-slit diffraction or a process using a halftone mask. The halftone mask includes a blocking region (also referred to as photoresist completely-reserved region) for blocking ultraviolet light, a partial transmissive region (also referred to as photoresist partially-reserved region) for allowing the ultraviolet light to partially transmit therethrough, and a transmissive region (also referred to as photoresist removal region) for allowing the ultraviolet light to completely transmit therethrough. Referring to FIGS. 2B and 2C, the photoresist completely-reserved region S1 is a region corresponding to the gate insulation layer 3 and the active layer 4, the photoresist partially-reserved region S2 includes a region in which an orthographic projection of the source electrode 5 is not covered by an orthographic projection of each of the gate insulation layer 3 and the active layer 4 and a region in which an orthographic projection of the drain electrode 6 is not covered by the orthographic projection of each of the gate insulation layer 3 and the active layer 4, and the remaining region is the photoresist removal region S3. Herein, an orthographic projection of a layer structure refers to an orthographic projection of the layer structure over the substrate 1.

Then, in a step S13, a pattern including the gate insulation layer 3 and the active layer 4 is formed by an ashing process and an etching process, such that an area of the orthographic projection of each of the gate insulation layer 3 and the active layer 4 on the source electrode 5 is less than that of the orthographic projection of the source electrode 5, and an area of the orthographic projection of each of the gate insulation layer 3 and the active layer 4 on the drain electrode 6 is less than that of the orthographic projection of the drain electrode 6.

FIGS. 2B and 2C illustrate that the patterns of the gate electrode 2, the source electrode 5, the drain electrode 6, the active layer 4 and the gate insulation layer 3 are formed by using the gray-tone or halftone mask process.

As illustrated in FIG. 2B, the photoresist 11 in the photoresist removal region S3 is removed by one exposure process, and a portion of the active film layer 40, the gate insulation film layer 30 and the first conductive film layer 20 not covered by the photoresist 11 is removed by the etching process, so the pattern including the gate electrode 2, the source electrode 5 and the drain electrode 6 is formed.

Figure 2D:
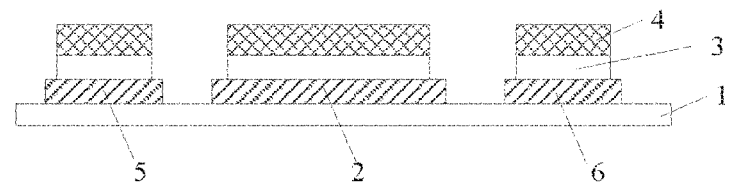

As illustrated in FIG. 2C, the photoresist 11 in the photoresist partially-reserved region S2 is removed by the ashing process, a portion of the active film layer 40 and the gate insulation film layer 30 not covered by the photoresist 11 is removed by the etching process, and the photoresist 11 in the photoresist completely-reserved region S1 is removed, so the pattern including the active layer 4 and the gate insulation layer 3 as illustrated in FIG. 2D is formed. In FIG. 2D, the source electrode 5 and the drain electrode 6 are located on both sides of the gate electrode 2, respectively, the active layer 4 and the gate insulation layer 3 each are located on the gate electrode 2, the source electrode 5 and the drain electrode 6, and at least a portion of each of the source and drain electrodes 5 and 6 exceeds the active layer 4 and the gate insulation layer 3 so as to be exposed.

Figure 2E:
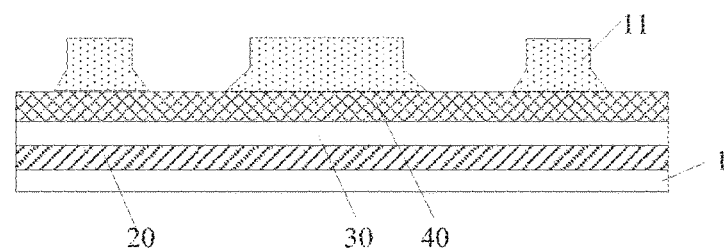
Figure 2F:
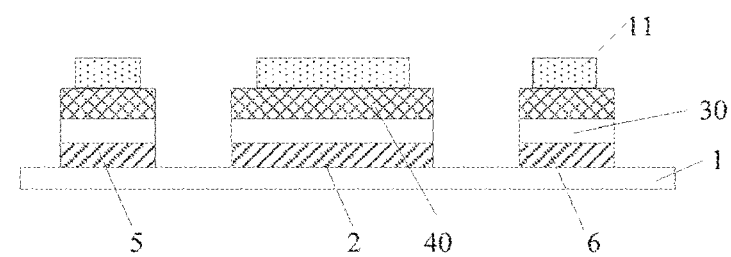

FIGS. 2E and 2F illustrate that the pattern including the gate electrode 2, the source electrode 5, the drain electrode 6, the active layer 4 and the gate insulation layer 3 is formed by performing a process of double-slit diffraction one time.

As illustrated in FIG. 2E, the photoresist 11 in the photoresist removal region S3 is removed by the process of double-slit diffraction, and a portion of the active film layer 40, the gate insulation film layer 30 and the first conductive film layer 20 not covered by the photoresist 11 is removed by the etching process, so the pattern including the gate electrode 2, the source electrode 5 and the drain electrode 6 is formed.

As illustrated in FIG. 2F, the photoresist 11 in the photoresist partially-reserved region is removed by the ashing process, a portion of the active film layer 40 and the gate insulation film layer 30 not covered by the photoresist 11 is removed by the etching process, and the photoresist 11 is also removed, so the pattern including the active layer 4 and the gate insulation layer 3 as illustrated in FIG. 2D is formed.

Here, a critical dimension bias (CD bias) of respective layers should be controlled in the etching process, that is, the line width of the metal electrodes (i.e., the gate electrode 2, the source electrode 5 and the drain electrode 6) formed from the first conductive film layer 20 is made larger than that of the gate insulation layer 3 and the active layer 4 to facilitate connection of the metal electrodes and the active layer 4. By performing the above steps, the active layer 4, the gate insulation layer 3, the gate electrode 2, the source electrode 5 and the drain electrode 6 are formed by using only one mask, and thus the fabrication process is greatly simplified.

Optionally, the active layer 4 is formed of a metal oxide. This results in not only easy acquisition of material and facilitation of cost control, but also high performance of the TFT.

Optionally, the gate electrode 2, the source electrode 5 and the drain electrode 6 are made of a same conductive material. The conductive material includes at least one of molybdenum (Mo), molybdenum niobium alloy (MoNb), aluminum (Al), aluminum neodymium alloy (AlNd), titanium (Ti) and copper (Cu). These materials are common in the field of semiconductor, thereby resulting in easy acquisition of material and facilitation of cost control.

In the method, a pattern including the passivation layer 7 and a via hole through the passivation layer 7 is formed by one patterning process.

Figure 2G:
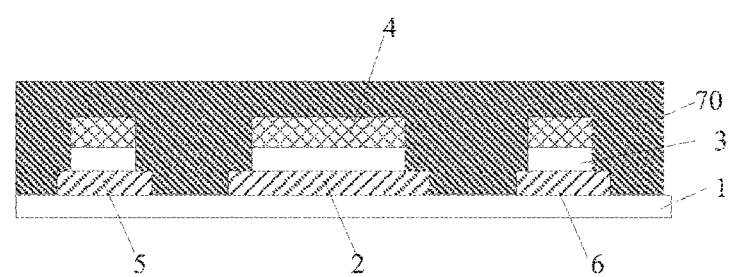
Figure 2H:
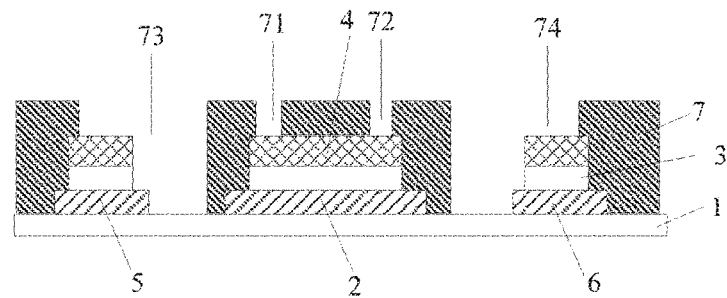

In a step S2, as illustrated in FIG. 2G a passivation film layer 70 is formed on the active layer 4; as illustrated in FIG. 2H, by one patterning process, a first via hole 71 and a second via hole 72 are formed in a region corresponding to the active layer 4 on the gate electrode 2 to each expose a portion of the active layer 4 on the gate electrode 2, a third via hole 73 is formed in a region corresponding to the source electrode 5 to expose at least a portion of the source electrode 5, and a fourth via hole 74 is formed in a region corresponding to the drain electrode 6 to expose at least a portion of the drain electrode 6. The portion (e.g., a portion of the active layer contacting with the gate insulation layer 3 in FIG. 2H) of the active layer 4 stacking with the gate electrode 2 and the gate insulation layer 3 may be referred to as a first region of the active layer, and the first via hole 71 and the second via hole 72 each expose a portion of the first region of the active layer.

In the method, a pattern including the connection electrode 8 is formed by one patterning process.

Figure 2I:
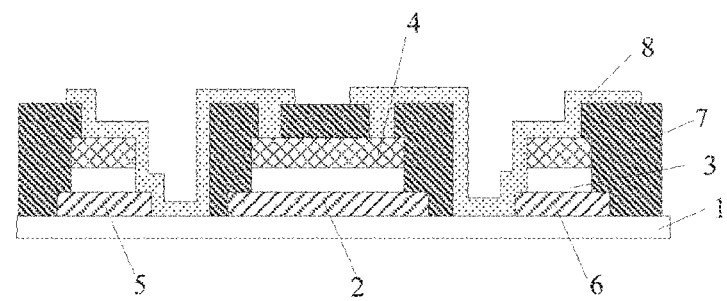

In a step S3, a second conductive film layer is formed over the passivation layer 7, and by one patterning process, the connection electrode 8 obtained by patterning the second conductive film layer electrically connects the source electrode 5 and the active layer 4 through the first via hole 71 and the third via hole 73, and electrically connects the drain electrode 6 and the active layer 4 through the second via hole 72 and the fourth via hole 74, as illustrated in FIG. 2I.

By the above procedures, the source electrode 5 and the drain electrode 6 are located on both sides of the gate electrode 2, respectively, the gate insulation layer 3 and the active layer 4 discretely cover the gate electrode 2, the source electrode 5 and the drain electrode 6 thereon, and the source electrode 5 and the drain electrode 6 are each electrically connected to the active layer 4 through the via holes and the connection electrode 8, so as to realize conduction of the source electrode 5, the drain electrode 6 and the active layer 4 under a certain voltage of the gate electrode 2 and ensure the normal performance of the TFT.

Figure 3A:
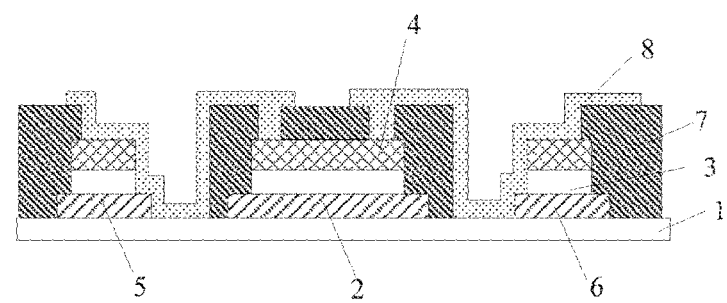
FIGS. 3A and 3B are structural schematic diagrams of a TFT according to an embodiment of the present invention.
Figure 3B:
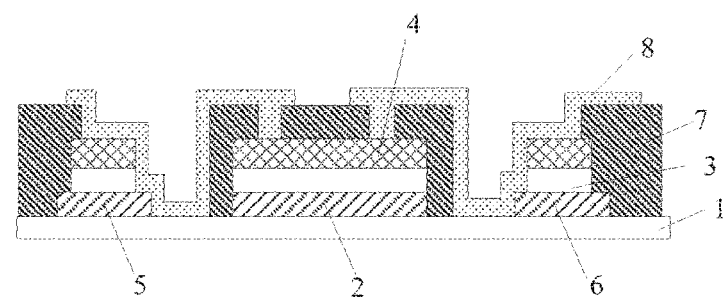

Accordingly, embodiments of the present invention provide a TFT which may be fabricated by using the method of fabrication a TFT as described above. As illustrated in FIG. 3A or 3B, the TFT includes the gate electrode 2, the gate insulation layer 3, the active layer 4, the source electrode 5, the drain electrode 6, the passivation layer 7 and the connection electrode 8. The gate electrode 2, the source electrode 5 and the drain electrode 6 are disposed in a same layer, coplanar and insulated from each other, the gate insulation layer 3 and the active layer 4 are disposed at a same side of the gate electrode 2 (i.e., both disposed on the gate electrode 2 or under the gate electrode 2), the passivation layer 7 is disposed on the gate electrode 2, the source electrode 5 and the drain electrode 6, the connection electrode 8 is disposed on the passivation layer 7, and the source and drain electrodes 5 and 6 are connected to the active layer 4 via the connection electrode 8, respectively. This TFT has a simple structure, a high yield rate and a low cost.

The active layer 4 is provided at least on the gate insulation layer 3 located on the gate electrode 2; the source electrode 5 and the drain electrode 6 are located on both sides of the gate electrode 2, respectively, and each connected to the active layer 4 by the connection electrode 8. In the present embodiment, the active layer 4 further covers the source electrode 5 and the drain electrode 6, respectively, that is, the gate insulation layer 3 and the active layer 4 are sequentially disposed on the gate electrode 2, the source electrode 5 and the drain electrode 6. Optionally, an area of the orthographic projection of each of the gate insulation layer 3 and the active layer 4 on the gate electrode 2 is less than that of the orthographic projection of the gate electrode 2, as illustrated in FIG. 3A; or, an area of the orthographic projection of each of the gate insulation layer 3 and the active layer 4 on the gate electrode 2 is equal to that of the orthographic projection of the gate electrode 2, as illustrated in FIG. 3B. An area of the orthographic projection of each of the gate insulation layer 3 and the active layer 4 on the source electrode 5 is less than that of the orthographic projection of the source electrode 5, and an area of the orthographic projection of each of the gate insulation layer 3 and the active layer 4 on the drain electrode 6 is less than that of the orthographic projection of the drain electrode 6.

Here, by setting the dimension of the gate insulation layer 3 and the active layer 4 with respect to the gate electrode 2, the source electrode 5 and the drain electrode 6, it facilitates the formation of the conductive channel of the TFT in the ON state. Since the gate insulation layer 3 and the active layer 4 located on the gate electrode 2 can be set as long as an area of the active layer 4 is sufficiently large to ensure that the source and drain electrodes 5 and 6 can contact the active layer 4 on the gate electrode 2 and thus realize turning on or off, an area of the orthographic projection of each of the gate insulation layer 3 and the active layer 4 can be either larger than or equal to that of the gate electrode 2. Since the portions of the gate insulation layer 3 and the active layer 4 located on the source electrode 5 and the drain electrode 6 are only dummy patterns formed due to the pattern of mask in the patterning process, it only requires that the area of each of the gate insulation layer 3 and the active layer 4 on the source electrode 5 is less than that of the source electrode 5 and the area of each of the gate insulation layer 3 and the active layer 4 on the drain electrode 6 is less than that of the drain electrode 6 such that the source and drain electrodes 5 and 6 can be connected to the active layer 4. Optionally, at least a portion of the source electrode 5 and at least a portion of the drain electrode 6 at a side proximal to the gate electrode 2 are exposed to ensure short-distance connection and good connection effect of the source and drain electrodes 5 and 6.

The passivation layer 7 is disposed on the active layer 4, and provided with the first via hole 71 and the second via hole 72 in the region corresponding to the active layer 4 on the gate electrode 2, a third via hole 73 in the region corresponding to the source electrode 5, and a fourth via hole 74 in the region corresponding to the drain electrode 6. The connection electrode 8 is disposed on the passivation layer 7, and is configured to electrically connect the source electrode 5 and the active layer 4 through the first via hole 71 and the third via hole 73 and electrically connect the drain electrode 6 and the active layer 4 through the second via hole 72 and the fourth via hole 74. In FIGS. 3A and 3B, the connection electrode 8 electrically connects to the source electrode 5 at a side proximal to the gate electrode 2 and the drain electrode 6 at a side proximal to the gate electrode 2, respectively, and electrically connects to the active layer 4 located on the gate electrode 2 through via holes, so as to realize the connection of the source electrode 5, the drain electrode 6 and the active layer 4 and ensure the performance of the TFT.

The method of fabricating the TFT has less steps and lower cost of masks, and the resulted TFT has a simple structure, a high yield rate and a low cost.

Embodiments of the present invention provide a TFT and a method of fabricating the same, the TFT has a simple structure, and the method of fabricating the same can effectively reduce the number of masks, improve production capability and save cost.

Referring to FIGS. 1, 4A-4I and 5A-5B, in a method of fabricating a TFT, the pattern including the gate electrode 2, the source electrode 5, the drain electrode 6, the active layer 4 and the gate insulation layer 3 is formed by one patterning process, the pattern including the passivation layer 7 and the via hole through the passivation layer 7 is formed by one patterning process, and the pattern of the connection electrode 8 is formed by one patterning process so as to electrically connect the source electrode 5 and the drain electrode 6 with the active layer 4. During the fabrication process of the TFT, the active layer 4, the gate insulation layer 3, the gate electrode 2, the source electrode 5 and the drain electrode 6 are formed by using only one mask, and the source electrode 5, the drain electrode 6 and the active layer 4 are then electrically connected by the connection electrode 8 to form a conductive channel of the TFT in the ON state. The method of fabricating the TFT effectively reduces the number of masks, improves production capability and saves cost.

In the method, a pattern including the gate electrode 2, the source electrode 5, the drain electrode 6, the active layer 4 and the gate insulation layer 3 is formed by one patterning process.

Figure 4A:
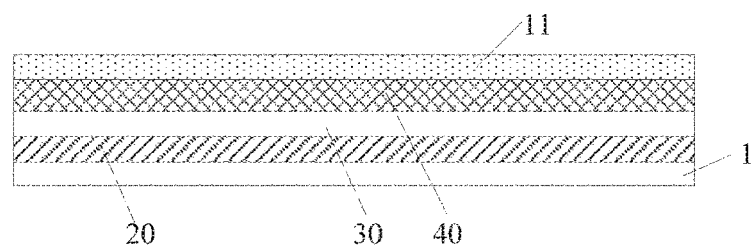
FIGS. 4A-4I are structural schematic diagrams illustrating a TFT fabricated by a method of fabricating the TFT according to an embodiment of the present invention.

In the step S11, the first conductive film layer, the gate insulation film layer and the active film layer are formed on the substrate sequentially in a direction away from the substrate. As illustrated in FIG. 4A, the first conductive film layer 20, the gate insulation film layer 30 and the active film layer 40 are sequentially formed, and the photoresist 11 covers the active film layer 40.

Figure 4B:
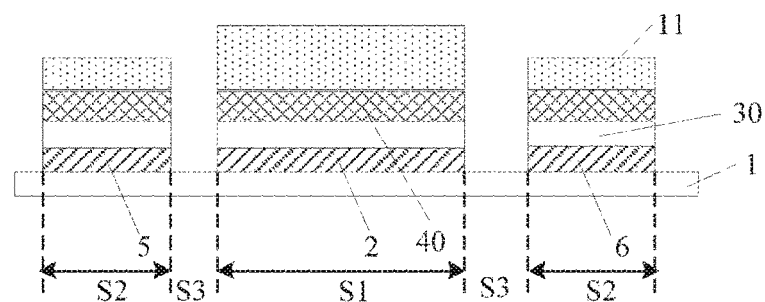

Then, in the step S12, the pattern including the gate electrode 2, the source electrode 5 and the drain electrode 6 is formed by performing an exposure process and an etching process one time. The exposure process herein is a process of double-slit diffraction or a process using a halftone mask. The halftone mask includes a blocking region (also referred to as photoresist completely-reserved region) for blocking ultraviolet light, a partial transmissive region (also referred to as photoresist partially-reserved region) for allowing the ultraviolet light to partially transmit therethrough, and a transmissive region (also referred to as photoresist removal region) for allowing the ultraviolet light to completely transmit therethrough. Referring to FIG. 4B, the photoresist completely-reserved region S1 is a region corresponding to the gate electrode 2, the photoresist partially-reserved region S2 is a region corresponding to the source electrode 5 and the drain electrode 6, and the remaining region is the photoresist removal region S3.

Then, in the step S13, the pattern including the gate insulation layer 3 and the active layer 4 is formed by an ashing process and an etching process, wherein the gate insulation layer 3 and the active layer 4 are formed only on the gate electrode 2.

Figure 4C:
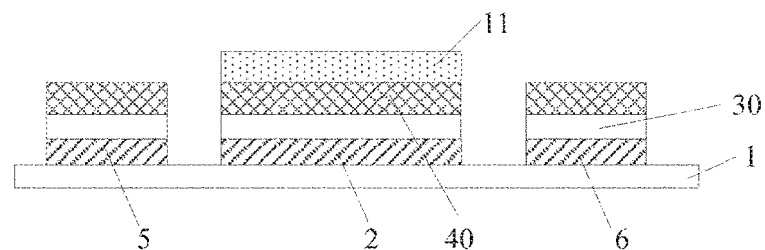

FIGS. 4B and 4C illustrate that the pattern including the gate electrode 2, the source electrode 5, the drain electrode 6, the active layer 4 and the gate insulation layer 3 is formed by using the gray-tone or halftone mask process.

As illustrated in FIG. 4B, the photoresist 11 in the photoresist removal region S3 is removed by one exposure process, and a portion of the active film layer 40, the gate insulation film layer 30 and the first conductive film layer 20 not covered by the photoresist 1 is removed by the etching process, so the pattern including the gate electrode 2, the source electrode 5 and the drain electrode 6 is formed.

Figure 4D:
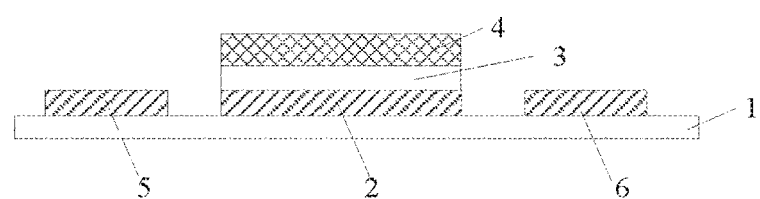

As illustrated in FIG. 4C, the photoresist 11 in the photoresist partially-reserved region S2 is removed by the ashing process, a portion of the active film layer 40 and the gate insulation film layer 30 not covered by the photoresist 11 is removed by the etching process, and the photoresist 11 in the photoresist completely-reserved region S1 is removed, so the pattern including the active layer 4 and the gate insulation layer 3 as illustrated in FIG. 4D is formed. In FIG. 4D, the source electrode 5 and the drain electrode 6 are located on both sides of the gate electrode 2, respectively, the active layer 4 and the gate insulation layer 3 each are located only on the gate electrode 2, and the entire source and drain electrodes 5 and 6 are exposed due to that the active layer 4 and the gate insulation layer 3 thereon are completely removed.

Figure 4E:
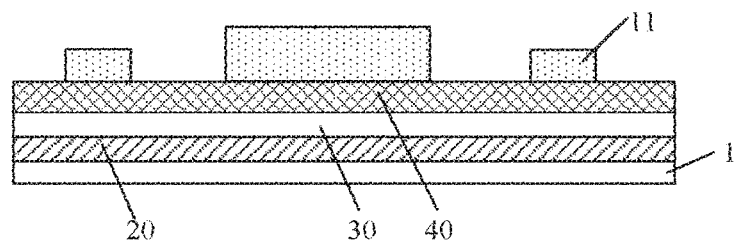
Figure 4F:
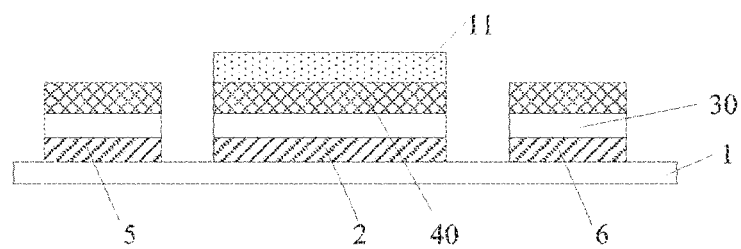

FIGS. 4E and 4F illustrate that the pattern including the gate electrode 2, the source electrode 5, the drain electrode 6, the active layer 4 and the gate insulation layer 3 is formed by performing a process of double-slit diffraction one time.

As illustrated in FIG. 4E, the photoresist 11 in the photoresist removal region S3 is removed by the process of double-slit diffraction, and a portion of the active film layer

40, the gate insulation film layer 30 and the first conductive film layer 20 not covered by the photoresist 11 is removed by the etching process, so the pattern including the gate electrode 2, the source electrode 5 and the drain electrode 6 is formed.

As illustrated in FIG. 4F, the photoresist 11 in the photoresist partially-reserved region is removed by the ashing process, a portion of the active film layer 40 and the gate insulation film layer 30 not covered by the photoresist 11 is removed by the etching process, and the photoresist 11 is also removed, so the pattern including the active layer 4 and the gate insulation layer 3 as illustrated in FIG. 4D is formed.

In the method of fabricating the TFT described with reference to FIGS. 4A-4I, the material of respective layer structures are the same as those in the method of fabricating the TFT described with reference to FIGS. 2A-2I, and the CD bias of the metal electrodes should also be noted, which are not described in detail herein.

In the method, the pattern including the passivation layer 7 and the via hole through the passivation layer 7 is formed by one patterning process.

Figure 4G:
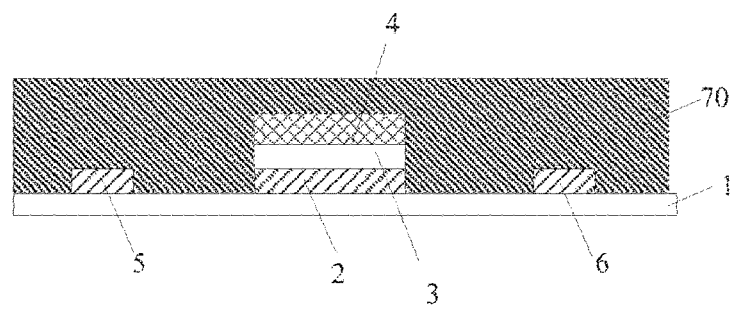
Figure 4H:
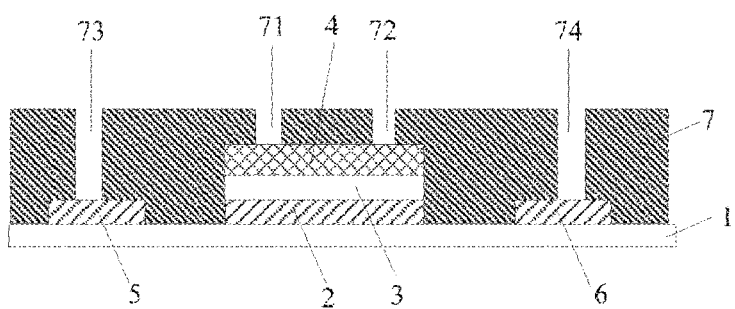

In the step S2, as illustrated in FIG. 4G, the passivation film layer 70 is formed on the active layer 4; as illustrated in FIG. 4H, by one patterning process, the first via hole 71 and the second via hole 72 are formed in the region corresponding to the active layer 4 to each expose a portion of the active layer 4 on the gate electrode 2, the third via hole 73 is formed in a region corresponding to the source electrode 5 to expose at least a portion of the source electrode 5, and the fourth via hole 74 is formed in a region corresponding to the drain electrode 6 to expose at least a portion of the drain electrode 6.

In the method, the pattern including the connection electrode 8 is formed by one patterning process.

Figure 4I:
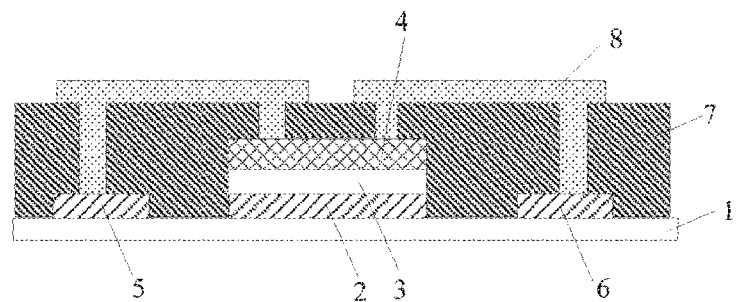

In the step S3, the second conductive film layer is formed over the passivation layer 7, and by one patterning process, the connection electrode 8 obtained by patterning the second conductive film layer electrically connects the source electrode 5 and the active layer 4 through the first via hole 71 and the third via hole 73, and electrically connects the drain electrode 6 and the active layer 4 through the second via hole 72 and the fourth via hole 74, as illustrated in FIG. 4I. The conduction of the source electrode 5, the drain electrode 6 and the active layer 4 is realized by the via holes and the connection electrode 8 to ensure the performance of the TFT.

Figure 5A:
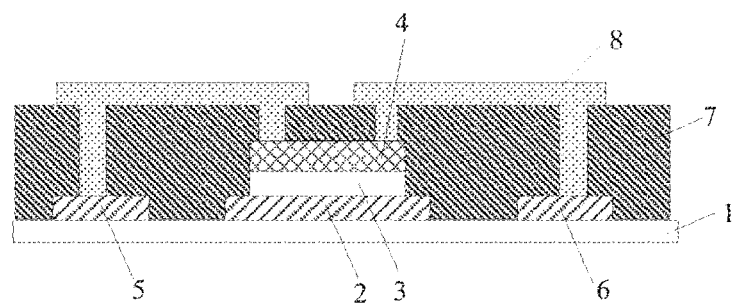
FIGS. 5A and 5B are structural schematic diagrams of a TFT according to an embodiment of the present invention.
Figure 5B:
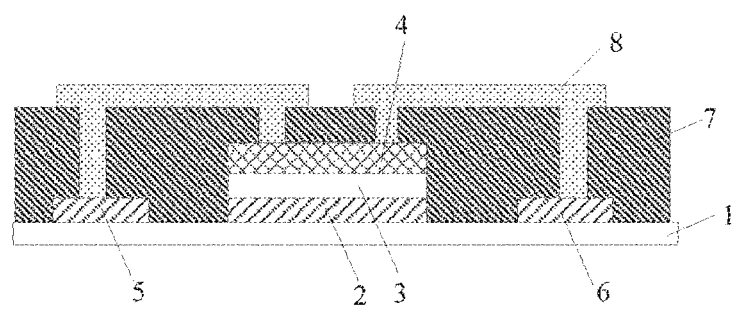

Accordingly, embodiments of the present invention provide a TFT which may be fabricated by using the method of fabrication a TFT as described above. As illustrated in FIG. 5A or 5B, the TFT includes the gate electrode 2, the gate insulation layer 3, the active layer 4, the source electrode 5, the drain electrode 6, the passivation layer 7 and the connection electrode 8. The gate electrode 2, the source electrode 5 and the drain electrode 6 are disposed in a same layer, coplanar and insulated from each other, the gate insulation layer 3 and the active layer 4 are disposed at a same side of the gate electrode 2 (i.e., both disposed on the gate electrode 2 or under the gate electrode 2), the passivation layer 7 is disposed on the gate electrode 2, the source electrode 5 and the drain electrode 6, the connection electrode 8 is disposed on the passivation layer 7, and the source and drain electrodes 5 and 6 are connected to the active layer 4 via the connection electrode 8, respectively. This TFT has a simple structure, a high yield rate and a low cost.

The gate insulation layer 3 and the active layer 4 are sequentially disposed on, and only on, the gate electrode 2. The area of the orthographic projection of each of the gate insulation layer 3 and the active layer 4 on the gate electrode 2 is less than that of the orthographic projection of the gate electrode 2, as illustrated in FIG. 5A; or, the area of the orthographic projection of each of the gate insulation layer 3 and the active layer 4 on the gate electrode 2 is equal to that of the orthographic projection of the gate electrode 2, as illustrated in FIG. 5B. Here, since the active layer 4 is located uppermost and the gate insulation layer 3 has an area equal to that of the active layer 4, an area of each of the gate insulation layer 3 and the active layer 4 can be either larger than or equal to that of the gate electrode 2; and there is no gate insulation layer 3 and active layer 4 provided on the source electrode 5 and the drain electrode 6.

The passivation layer 7 is disposed on the active layer 4, and provided with the first via hole 71 and the second via hole 72 in the region corresponding to the active layer 4, a third via hole 73 in the region corresponding to the source electrode 5, and a fourth via hole 74 in the region corresponding to the drain electrode 6. The connection electrode 8 is disposed on the passivation layer 7, and is configured to electrically connect the source electrode 5 and the active layer 4 through the first via hole 71 and the third via hole 73 and electrically connect the drain electrode 6 and the active layer 4 through the second via hole 72 and the fourth via hole 74. In FIGS. 5A and 5B, since the active layer 4 is located uppermost and there is no gate insulation layer 3 and active layer 4 provided on the source electrode 5 and the drain electrode 6, the connection electrode 8 electrically connects, through the via holes, the source electrode 5 and the drain electrode 6 with the active layer 4 on the gate electrode 2 to realize the connection of the source electrode 5, the drain electrode 6 and the active layer 4, and thus a conductive channel in the ON state is formed and the performance of the TFT is ensured.

The method of fabricating the TFT has less steps and lower cost of masks, and the resulted TFT has a simple structure, a high yield rate and a low cost. In addition, as compared to the TFT as illustrated in FIGS. 3A and 3B, the structure of the resulted TFT is simpler and the performance thereof is more stable.

Embodiments of the present invention provide a TFT and a method of fabricating the same, the TFT has a simple structure, and the method of fabricating the same can effectively reduce the number of masks, improve production capability and save cost.

Referring to FIGS. 1, 6A-6I and 7, in a method of fabricating a TFT, the pattern including the gate electrode 2, the source electrode 5, the drain electrode 6, the active layer 4 and the gate insulation layer 3 is formed by one patterning process, the pattern including the passivation layer 7 and the via hole through the passivation layer 7 is formed by one patterning process, and the pattern of the connection electrode 8 is formed by one patterning process so as to electrically connect the source electrode 5 and the drain electrode 6 with the active layer 4. During the fabrication process of the TFT, the active layer 4, the gate insulation layer 3, the gate electrode 2, the source electrode 5 and the drain electrode 6 are formed by using only one mask, and the source electrode 5, the drain electrode 6 and the active layer 4 are then electrically connected by the connection electrode 8 to form a conductive channel of the TFT in the ON state. The method of fabricating the TFT effectively reduces the number of masks, improves production capability and saves cost.

In the method, the pattern including the gate electrode 2, the source electrode 5, the drain electrode 6, the active layer 4 and the gate insulation layer 3 is formed by one patterning process.

Figure 6A:
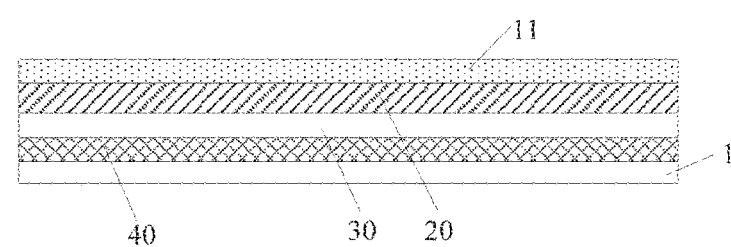
FIGS. 6A-6I are structural schematic diagrams illustrating a TFT fabricated by a method of fabricating the TFT according to an embodiment of the present invention.

In the step S11, the active film layer 40, the gate insulation film layer 30 and the first conductive film layer 20 are formed on the substrate sequentially in a direction away from the substrate. As illustrated in FIG. 6A, the active film layer 40, the gate insulation film layer 30 and the first conductive film layer 20 are sequentially formed, and the photoresist 11 covers the first conductive film layer 20.

Figure 6B:
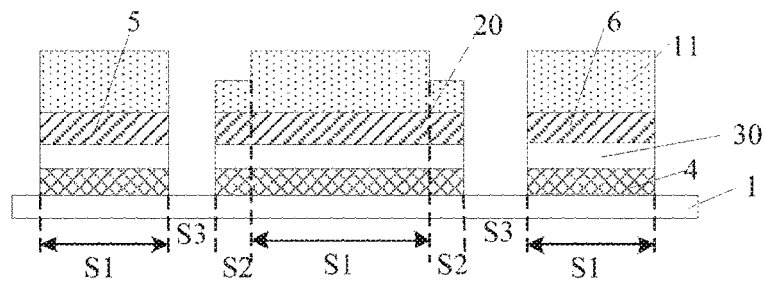

Then, in the step S12, the pattern including the active layer 4, the source electrode 5 and the drain electrode 6 is formed by performing an exposure process and an etching process one time. The exposure process herein is a process of double-slit diffraction or a process using a halftone mask. The halftone mask includes a blocking region (also referred to as photoresist completely-reserved region) for blocking ultraviolet light, a partial transmissive region (also referred to as photoresist partially-reserved region) for allowing the ultraviolet light to partially transmit therethrough, and a transmissive region (also referred to as photoresist removal region) for allowing the ultraviolet light to completely transmit therethrough. Referring to FIG. 6B, the photoresist completely-reserved region S1 includes a region corresponding to the source electrode 5, a region corresponding to the drain electrode 6 and a region corresponding to the gate insulation layer 3 and the gate electrode 2, the photoresist partially-reserved region S2 includes a region in which the orthographic projection of the active layer 4 is not covered by the orthographic projection of the gate insulation layer 3 and the gate electrode 2, and the remaining region is the photoresist removal region S3.

Then, in the step S13, the pattern including the gate insulation layer 3 and the gate electrode 2 is formed by an ashing process, such that the area of the orthographic projection of the active layer 4 is larger than that of the orthographic projection of the gate insulation layer 3 and the gate electrode 2.

Figure 6C:
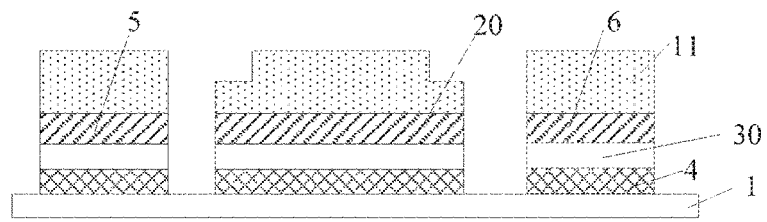

FIGS. 6B and 6C illustrate that the pattern including the gate electrode 2, the source electrode 5, the drain electrode 6, the active layer 4 and the gate insulation layer 3 is formed by using the gray-tone or halftone mask process.

As illustrated in FIG. 6B, the photoresist 11 in the photoresist removal region S3 is removed by one exposure process, and a portion of the active film layer 40, the gate insulation film layer 30 and the first conductive film layer 20 not covered by the photoresist 11 is removed by the etching process, so the pattern including the active layer 4, the source electrode 5 and the drain electrode 6 is formed.

Figure 6D:
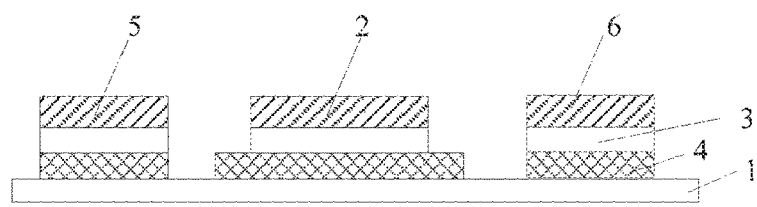

As illustrated in FIG. 6C, the photoresist 11 in the photoresist partially-reserved region S2 is removed by the ashing process, a portion of the first conductive film layer 20 and the gate insulation film layer 30 not covered by the photoresist 11 is removed by the etching process, and the photoresist 11 in the photoresist completely-reserved region S1 is removed, so the pattern including the gate electrode 2 and the gate insulation layer 3 as illustrated in FIG. 6D is formed. In FIG. 6D, the source electrode 5 and the drain electrode 6 are located on both sides of the gate electrode 2, respectively, the active layer 4 and the gate insulation layer 3 each are located under the gate electrode 2, the source electrode 5 and the drain electrode 6. An area of the gate insulation layer 3 under the gate electrode 2 is equal to that of the gate electrode 2, and an area of each of the active layer 4 under the gate electrode 2 is larger than that of the gate electrode 2, so at least the portion of the active layer 4 exceeding the gate electrode 2 exposes with respect to the gate electrode 2 and the gate insulation layer 3.

Figure 6E:
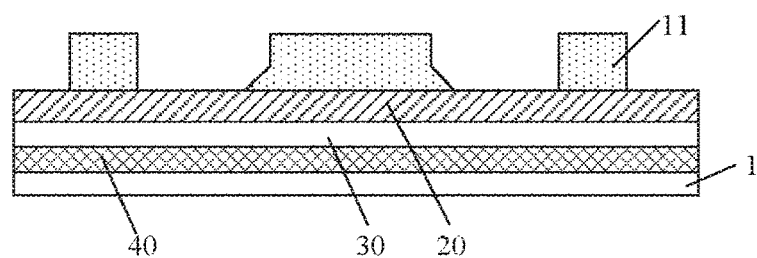
Figure 6F:
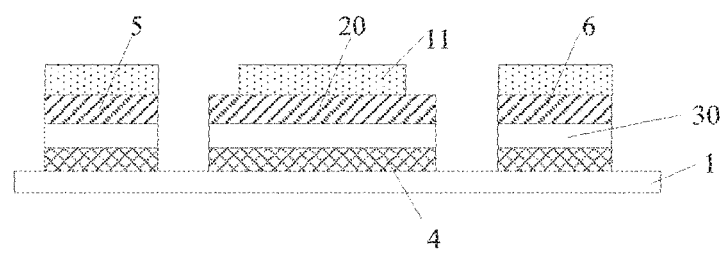

FIGS. 6E and 6F illustrate that the pattern including the gate electrode 2, the source electrode 5, the drain electrode 6, the active layer 4 and the gate insulation layer 3 is formed by performing a process of double-slit diffraction one time.

As illustrated in FIG. 6E, the photoresist 11 in the photoresist removal region is removed by the process of double-slit diffraction, and a portion of the active film layer 40, the gate insulation film layer 30 and the first conductive film layer 20 not covered by the photoresist 11 is removed by the etching process, so the pattern including the active layer 4, the source electrode 5 and the drain electrode 6 is formed.

As illustrated in FIG. 6F, the photoresist 11 in the photoresist partially-reserved region is removed by the ashing process, a portion of the first conductive film layer 20 and the gate insulation film layer 30 not covered by the photoresist 11 is removed by the etching process, and the photoresist 11 is also removed, so the pattern including the gate electrode 2 and the gate insulation layer 3 as illustrated in FIG. 6D is formed.

In the method of fabricating the TFT described with reference to FIGS. 6A-6I, the material of respective layer structures are the same as those in the method of fabricating the TFT described with reference to FIGS. 2A-2I, and the CD bias of the metal electrodes should also be noted, which are not described in detail herein.

In the method, the pattern including the passivation layer 7 and the via hole through the passivation layer 7 is formed by one patterning process.

Figure 6G:
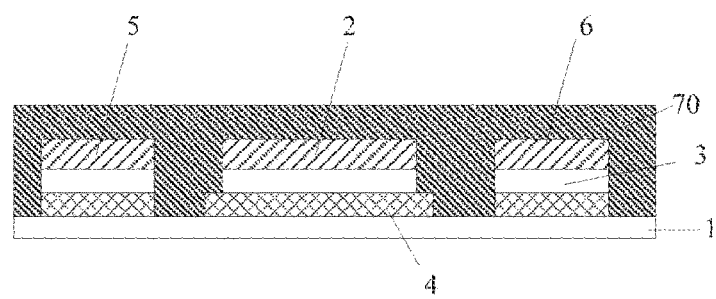
Figure 6H:
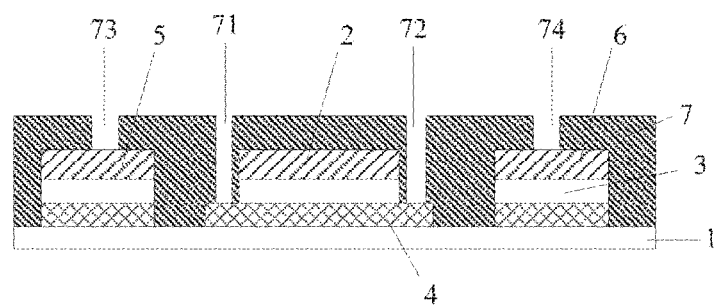

In the step S2, as illustrated in FIG. 6G, the passivation film layer 70 is formed on the gate electrode 2, the source electrode 5 and the drain electrode 6; as illustrated in FIG. 6H, by one patterning process, the first via hole 71 and the second via hole 72 are formed in the first region of the active layer 4 stacking with the gate insulation layer and the gate electrode, the third via hole 73 is formed in the region corresponding to the source electrode 5, and the fourth via hole 74 is formed in the region corresponding to the drain electrode 6. Specifically, the first via hole 71 and the second via hole 72 are formed in an area of the first region of the active layer 4 not covered by the gate electrode 2, and optionally, the first via hole 71 and the second via hole 72 are located at both sides of the gate electrode 2, respectively.

In the method, the pattern including the connection electrode 8 is formed by one patterning process.

Figure 6I:
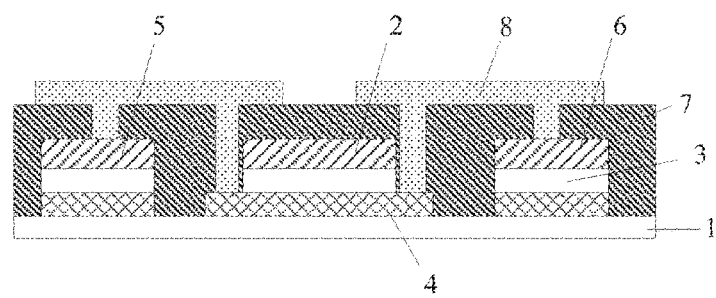

In the step S3, the second conductive film layer is formed over the passivation layer 7, and by one patterning process, the connection electrode 8 obtained by patterning the second conductive film layer electrically connects the source electrode 5 and the active layer 4 through the first via hole 71 and the third via hole 73, and electrically connects the drain electrode 6 and the active layer 4 through the second via hole 72 and the fourth via hole 74, as illustrated in FIG. 6I. The conduction of the source electrode 5, the drain electrode 6 and the active layer 4 is realized by the via holes and the connection electrode 8 to ensure the performance of the TFT.

Figure 7:
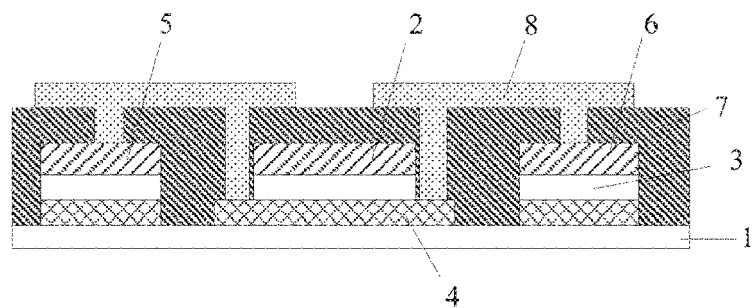
FIG. 7 is a structural schematic diagram of a TFT according to an embodiment of the present invention.

Accordingly, embodiments of the present invention provide a TFT which may be fabricated by using the method of fabrication a TFT as described above. As illustrated in FIG. 7, the TFT includes the gate electrode 2, the gate insulation layer 3, the active layer 4, the source electrode 5, the drain electrode 6, the passivation layer 7 and the connection electrode 8. The gate electrode 2, the source electrode 5 and the drain electrode 6 are disposed in a same layer, coplanar and insulated from each other, the gate insulation layer 3 and the active layer 4 are disposed at a same side of the gate electrode 2 (in this embodiment, both disposed under the gate electrode 2), the passivation layer 7 is disposed on the gate electrode 2, the source electrode 5 and the drain electrode 6, the connection electrode 8 is disposed on the passivation layer 7, and the source and drain electrodes 5 and 6 are connected to the active layer 4 via the connection electrode 8, respectively. This TFT has a simple structure, a high yield rate and a low cost.

The gate insulation layer 3 and the active layer 4 are sequentially disposed under the gate electrode 2, the source electrode 5 and the drain electrode 6. The area of the orthographic projection of the active layer 4 is larger than that of the orthographic projection of each of the gate insulation layer 3 and the gate electrode 2. In this case, dummy active layer 4 and dummy gate insulation layer 3 are provided under the source electrode 5 and the drain electrode 6. Since the active layer 4 is located nethermost, at least a portion thereof is exposed by setting the area of the active layer 4 larger than that of each of the gate insulation layer 3 and the gate electrode 2 thereon; the source electrode 5 and the drain electrode 6 are coplanar with the gate electrode 2, and they are located uppermost.

The passivation layer 7 is disposed on the gate electrode 2, the source electrode 5 and the drain electrode 6, and provided with the first via hole 71 and the second via hole 72 in the region corresponding to a portion of the active layer 4 not covered by the gate electrode 2, the third via hole 73 in the region corresponding to the source electrode 5, and the fourth via hole 74 in the region corresponding to the drain electrode 6. The connection electrode 8 is disposed on the passivation layer 7, and is configured to electrically connect the source electrode 5 and the active layer 4 through the first via hole 71 and the third via hole 73 and electrically connect the drain electrode 6 and the active layer 4 through the second via hole 72 and the fourth via hole 74. In FIG. 7, since at least a portion of the active layer 4 is exposed and the source and drain electrodes 5 and 6 are located uppermost, the connection electrode 8 electrically connects through the via holes to the active layer 4 under the gate electrode 2 to realize the connection of the source electrode 5, the drain electrode 6 and the active layer 4, and thus a conductive channel in the ON state is formed and the performance of the TFT is ensured.

The method of fabricating the TFT has less steps and lower cost of masks, and the resulted TFT has a simple structure, a high yield rate and a low cost.

FIGS. 2A-2I and 4A-4I illustrate that a bottom-gate coplanar TFT is formed by using three patterning processes, and FIGS. 6A-6I illustrate that a top-gate coplanar TFT is formed by using three patterning processes. These TFTs each has a simple structure and low cost, and in the corresponding fabrication method, a complete structure of a TFT can be formed by only three patterning processes, and thus the number of masks can be effectively reduced, the production capability can be improved and the cost can be saved.

In the method of fabricating a TFT according to the embodiments of the present invention, an entire TFT can be completely fabricated by only three patterning processes, and thus this method is particularly suitable for the fabrication of the oxide TFTs.

Embodiments of the present invention provide an array substrate including any one of the above-described TFTs formed by corresponding fabrication method.

Figure 8:
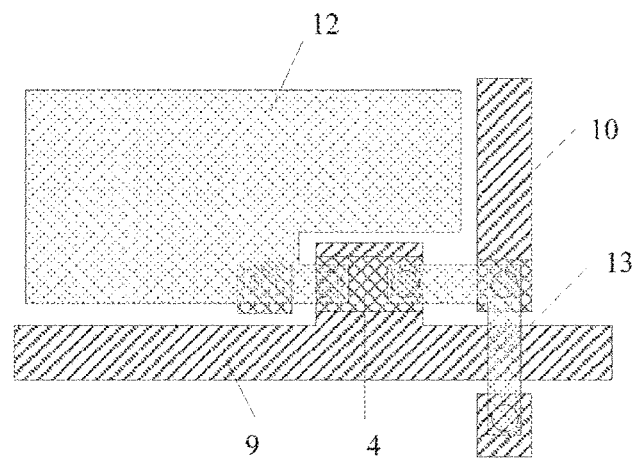
FIG. 8 is a structural schematic diagram of an array substrate according to an embodiment of the present invention.

As illustrated in FIG. 8, an array substrate includes a plurality of pixel regions and the above-described TFT, wherein the TFT is disposed at a corner of each of the pixel regions, and the drain electrode 6 of the TFT is configured to extend towards a center of each of the pixel regions to form a pixel electrode 12. Here, the pixel electrode 12 is formed simultaneously with the connection electrode 8, and thus the pixel structure can be formed without increasing any process. In addition, to facilitate observation of the layer structures under the pixel electrode 12, the filling pattern of the pixel electrode 12 is provided with a transparency to show the profile of the layer structures thereunder.

In other words, in the formation of the pixel electrode of the array substrate, the connection of the source electrode 5, the drain electrode 6 and the actively layer 4 is formed through the via holes. In the embodiments as illustrated in FIGS. 4A-7, since the passivation layer 7 is provided directly on the drain electrode 6 and the pixel electrode 12 is provided on the passivation layer 7, even the mask for forming the drain electrode of the TFT and the mask for forming the pixel electrode may be further improved such that the pattern of the layer structure of the drain electrode 6 is omitted in the step S1 and the corresponding region is exposed by the passivation layer 7 in the step S2, whereas the drain electrode 6 is formed simultaneously with the formation of the pixel electrode 12 in the step S3, and the pixel electrode 12 is made connected to the active layer 4.

The array substrate includes a gate line 9 and a data line 10 intersecting with each other and defining the pixel regions. The plurality of pixel regions are arranged in a matrix, and each of the pixel regions is provided with pixels, each of which includes at least one TFT. The TFT is provided with a turning-on signal by the gate line 9 and a gray scale signal by the data line 10 to achieve turning on of the pixel and thus displaying an image. The gate line 9 is connected to the gate electrode 2 (in other words, the gate line 9 is introduced from the gate electrode 2), and the data line 10 is connected to the source electrode 5 (in other words, the gate line 10 is introduced from the source electrode 5). One of the data line 10 and the gate line 9 is disconnected in the intersection area, and the disconnected data line 10 or gate line 9 is connected via a line connection electrode 13 formed in the same layer as the second conductive film layer. The gate line 9 or the data line 10 is disconnected at the intersection area where the gate line 9 and the data line 10 intersect with each other and is electrically connected in a different layer, thereby simplifying the layer structure.

Figure 9A:
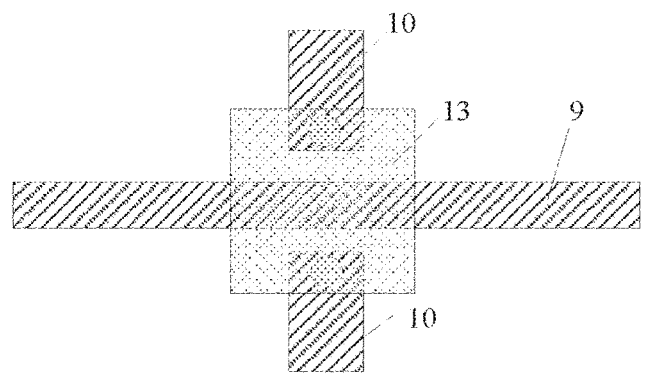
FIGS. 9A and 9B are structural schematic diagrams illustrating an intersection portion of a gate line and a data line of an array substrate according to an embodiment of the present invention.
Figure 9B:
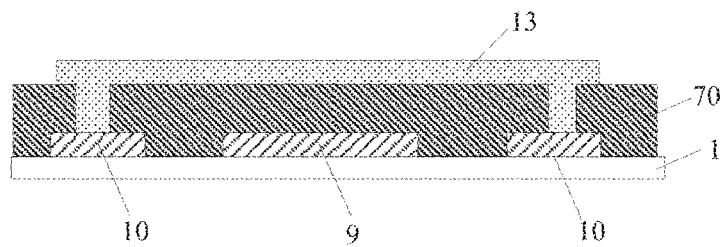

FIG. 8 illustrates a case where the data line 10 is disconnected in the intersection area. Specifically, as illustrated in the partial plan view of the intersection area of the gate line 9 and the data line 10 of FIG. 9A, the data line 10 is disconnected and the gate line 9 passes between the two disconnected sections of the data line 10, wherein the two disconnected sections of the data line 10 are connected by the line connection electrode 13. Taking the structure of TFT according to FIGS. 5A and 5B as an example, FIG. 9B illustrates the two disconnected sections of the data line 10 connected by the line connection electrode 13.

Figure 9C:
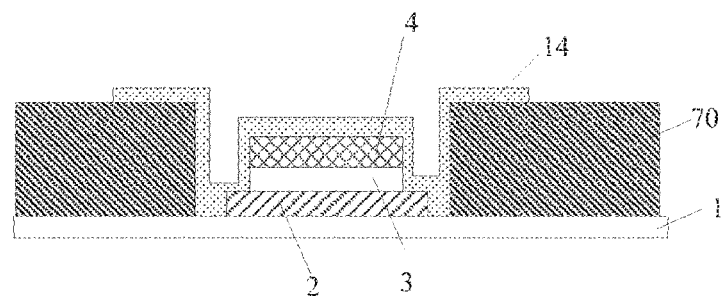
FIGS. 9C and 9D are structural schematic diagrams of a structure introducing the gate line and the data line of the array substrate according to an embodiment of the present invention.
Figure 9D:
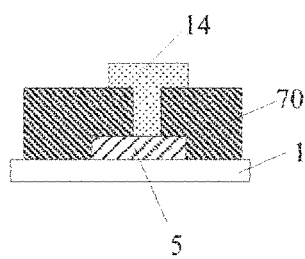

In addition, in the display region, the gate line 9 may be introduced directly from the gate electrode 2 and the data line 10 may be introduced directly from the source electrode 5. FIG. 9C is a structural schematic diagram illustrating that the gate line 9 is introduced from the gate electrode 2 of the TFT according to FIGS. 3A and 3B by an end connection electrode 14, and FIG. 9D is a structural schematic diagram illustrating that the data line 10 is introduced from the source electrode 5 of the TFT according to FIGS. 5A and 5B by the end connection electrode 14. The so-called "end connection electrode" is a conductive layer introducing the connection line from the electrode end. It can be seen that the electrode leading wires can be implemented as long as an opening hole through the passivation layer is provided on and in correspondence to the gate electrode 22 or the source electrode 5, without increasing the difficulty of process or the complexity of structure.

Figure 9E:
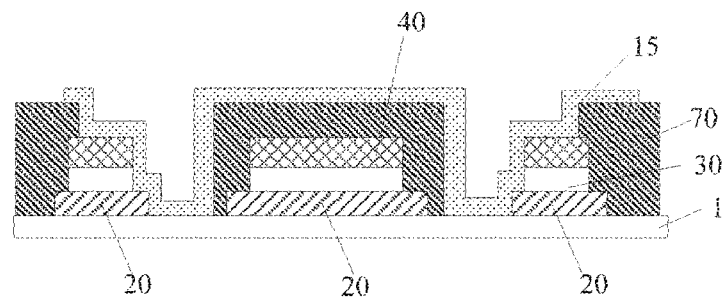
FIG. 9E is a structural schematic diagram of a non-display region of the array substrate according to an embodiment of the present invention.

In addition, a gate driving chip and a source driving chip are further provided in the non-display region of the array substrate to provide a gate-line scanning signal and an image data signal to the pixel structures in the display region. The gate driving chip is connected to the gate electrode 2 of the TFT via a connection wire and the gate line 9, and the source driving chip is connected to the source electrode 5 of the TFT via a connection wire and the data line 10. The connection wire refers to a metal connection line between the gate lines 9 or the data lines 10 and connected from the driving chip in the non-display region to the display region. The connection wires are formed at the same time as the formation of the electrodes of the TFT or the formation of the connection electrode 8. Taking the structure of the TFT with reference to FIGS. 2A to 3B as an example, FIG. 9E illustrates a structure in which the connection wire 15 is formed from the second conductive film layer, wherein the first conductive film layer 20 indicates a conductive layer that may serve as fan-out lines requiring cross-wire connection.

The array substrate has a simple structure and a low cost, and is light and thin.

Embodiments of the present invention provide a display apparatus including the array substrate described with reference to FIGS. 8 to 9E.

The display apparatus may be any product or component with a function of display such as a liquid crystal panel, an electronic paper, an OLED panel, a mobile phone, a tablet computer, a television, a monitor, a laptop, a digital photo frame, a navigator or the like.

The display apparatus has a simple structure and a low cost, and is light and thin.

It can be understood that the foregoing embodiments are merely exemplary embodiments used for describing the principle of the present invention, but the present invention is not limited thereto. Those of ordinary skill in the art may make various variations and improvements without departing from the spirit and essence of the present invention, and these variations and improvements shall also fall into the protection scope of the present invention.

What is claimed is:

1. A method of fabricating a thin film transistor comprising a substrate, a gate electrode, a gate insulation layer, an active layer, a source electrode, a drain electrode, a passivation layer and a connection electrode, the method comprising:
    forming a first conductive film layer, a gate insulation film layer and an active film layer on the substrate;
    patterning the first conductive film layer, the active film layer and the gate insulation film layer by one patterning process to form a pattern of the gate electrode, the source electrode and the drain electrode, a pattern of the active layer, and a pattern of the gate insulation layer, respectively;
    forming a passivation film layer on a side of the gate electrode, the source electrode, the drain electrode, the active layer and the gate insulation layer distal to the substrate;
    patterning the passivation film layer by one patterning process to form a pattern comprising the passivation layer and a via hole through the passivation layer;
    forming a second conductive film layer on a side of the passivation layer distal to the substrate; and
    patterning the second conductive film layer by one patterning process to form a pattern of the connection electrode, the connection electrode being configured to electrically connect the source electrode and the drain electrode to the active layer, respectively,
    wherein the first conductive film layer, the gate insulation film layer and the active film layer are formed on the substrate sequentially in a direction away from the substrate.

2. The method according to claim 1, wherein the step of forming the patterns of the gate electrode, the source electrode, the drain electrode, the active layer and the gate insulation layer by one patterning process further comprises:
    forming the pattern of the gate electrode, the source electrode and the drain electrode by performing an exposure process and an etching process one time; and
    forming the patterns of the gate insulation layer and the active layer by an ashing process and an etching process, such that the source electrode and the drain electrode are at least partially exposed.

3. The method according to claim 2, wherein the exposure process is performed by using a halftone mask which comprises a blocking region for blocking ultraviolet light, a partial transmissive region for allowing the ultraviolet light to partially transmit therethrough, and a transmissive region for allowing the ultraviolet light to completely transmit therethrough; an orthographic projection of each of the gate insulation layer and the active layer completely overlaps with that of the blocking region, an orthographic projection of a portion of each of the source electrode and the drain electrode not covered by the gate insulation layer and the active layer completely overlaps with an orthographic projection of the partial transmissive region, and an orthographic projection of gaps between the source electrode, the drain electrode and the gate electrode completely overlaps with that of the transmissive region.

4. The method according to claim 2, wherein during the ashing process and the etching process, the patterns of the active layer and the gate insulation layer are formed on the gate electrode, the drain electrode and the source electrode, and
    an area of an orthographic projection of each of the gate insulation layer and the active layer on the source electrode is less than that of an orthographic projection of the source electrode, and an area of an orthographic projection of each of the gate insulation layer and the active layer on the drain electrode is less than that of an orthographic projection of the drain electrode.

5. The method according to claim 2, wherein during the ashing process and the etching process, the patterns of the gate insulation layer and the active layer are formed only on the gate electrode.

6. The method according to claim 2, wherein the exposure process is a process of double-slit diffraction.

7. The method according to claim 1, wherein the step of forming the pattern comprising the passivation layer and the via hole through the passivation layer comprises:
    forming a first via hole and a second via hole through the passivation layer to expose portions of a first region of the active layer, respectively, the first region of the active layer being stacked with the gate insulation layer and the gate electrode, and an orthographic projection of at least a portion of the first region of the active layer overlapping with that of the gate electrode; and forming a third via hole through the passivation layer to expose a portion of the source electrode, and forming a fourth via hole through the passivation layer to expose a portion of the drain electrode, wherein the connection electrode is formed to electrically connect the source electrode and the active layer via the first via hole and third via hole and electrically connect the drain electrode and the active layer via the second via hole and fourth via hole.

8. The method according to claim 1, wherein the active layer is formed of a metal oxide.

\* \* \* \* \*